United States Patent
Chow et al.

(10) Patent No.: US 7,471,556 B2
(45) Date of Patent: Dec. 30, 2008

(54) LOCAL BANK WRITE BUFFERS FOR ACCELERATING A PHASE-CHANGE MEMORY

(75) Inventors: David Q. Chow, San Jose, CA (US);
Charles C. Lee, Cupertino, CA (US);
Frank I-Kang Yu, Palo Alto, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 52 days.

(21) Appl. No.: 11/748,595

(22) Filed: May 15, 2007

(65) Prior Publication Data

US 2008/0285334 A1    Nov. 20, 2008

(51) Int. Cl.
*G11C 11/00* (2006.01)
(52) U.S. Cl. ............... 365/163; 365/230.03; 365/189.05
(58) Field of Classification Search ............... 365/163, 365/230.03, 189.05, 230.06
See application file for complete search history.

(56) References Cited

U.S. PATENT DOCUMENTS

| | | | |
|---|---|---|---|
| 5,933,365 A | 8/1999 | Klersy et al. | |
| 6,512,241 B1 | 1/2003 | Lai | |
| 6,869,883 B2 | 3/2005 | Chiang et al. | |
| 7,026,639 B2 | 4/2006 | Cho et al. | |
| 7,078,273 B2 | 7/2006 | Matsuoka et al. | |
| 7,099,179 B2 * | 8/2006 | Rinerson et al. | 365/148 |
| 7,103,718 B2 | 9/2006 | Nickel et al. | |
| 7,259,983 B2 * | 8/2007 | Bill et al. | 365/163 |
| 2003/0223285 A1 | 12/2003 | Khouri et al. | |
| 2004/0228163 A1 | 11/2004 | Khouri et al. | |
| 2004/0248339 A1 | 12/2004 | Lung | |
| 2004/0256610 A1 | 12/2004 | Lung | |
| 2005/0185572 A1 | 8/2005 | Resta et al. | |
| 2006/0018183 A1 | 1/2006 | De Sandre et al. | |
| 2006/0097239 A1 | 5/2006 | Hsiung | |
| 2006/0126381 A1 | 6/2006 | Khouri et al. | |
| 2006/0203542 A1 | 9/2006 | Kurotsuchi et al. | |
| 2006/0274574 A1 | 12/2006 | Choi et al. | |

* cited by examiner

*Primary Examiner*—Huan Hoang
(74) *Attorney, Agent, or Firm*—Stuart T. Auvinen

(57) ABSTRACT

Phase-change memory (PCM) cells store data using alloy resistors in high-resistance amorphous and low-resistance crystalline states. The time of the memory cell's set-current pulse can be 100 ns, much longer than read or reset times. The write time thus depends on the write data. The very long write-1 time may require wait states. To eliminate wait states for sequential accesses, the PCM cells are divided into 16 banks. Each bank has its own bank write latch that stores data locally at the bank while the bank is being written. Data lines to the banks are freed up to transfer data to other banks once the data is written into the local bank write latch, allowing the long set-current pulse to be applied locally to slowly grow crystals in the alloy resistors. External host data are buffered and applied to the data lines by an array data mux.

20 Claims, 14 Drawing Sheets

LOCAL BANK WRITE BUFFERS FOR ACCELERATING A PHASE-CHANGE MEMORY

FIELD OF THE INVENTION

This invention relates to phase-change memories, and more particularly to bank interleaving and bank local-latching to accommodate asymmetric write times of phase-change memory cells.

BACKGROUND OF THE INVENTION

Computer code, instructions, user data and other kinds of data have been stored in main memories and peripheral memories that employ a wide variety of technologies. Main memories often use dynamic-random-access memory (DRAM), while faster cache memories and on-chip memories may use static random-access memory (SRAM). Read-only-memory (ROM) may use fuses or masked metal options, or may use electrically-erasable programmable read-only memory (EEPROM) cells. These are randomly-accessible memories since individual words can be read or written without disturbing nearby data. Often individual bytes may be written.

Mass storage memory is block-addressable, where a block of 512 or more bytes must be read or written together as a block. Individual words of 64 bytes or less cannot be separately written without re-writing the whole 512-byte block. Mass storage devices include rotating magnetic disks, optical disks, and EEPROM arranged as flash memory.

Traditionally, flash memory has been used for non-volatile storage. Another kind of non-volatile memory, phase-change memory, was discovered in the 1960's, and was even written about in a paper in Electronics magazine in September 1970 by the founder of Intel Corp., Gordon Moore. However, despite the long-felt need, this 40-year-old technology has not yet been widely used in personal computers and other systems.

Phase-change memory (PCM) uses a layer of chalcogenide glass that can be switched between a crystalline and an amorphous state. The chalcogenide glass layer can be an alloy of germanium (Ge), antimony (Sb), and tellurium (Te). This alloy has a high melting point, which produces the amorphous state when cooled from the melting point. However, when the solid alloy is heated from the amorphous state, the alloy transforms into a crystalline state at a crystallization temperature that is below its melting point. Such heating can be provided by an electric current through the alloy. The state change may occur rapidly, such as in as little as 5 nanoseconds.

One problem with phase-change memory is that write times are data-sensitive. Writing a 1 into a PCM cell may require 100 ns, while writing a 0 to a PCM cell may require only 5 or 10 ns. The cell read time may be relatively short, such as 2-10 ns. Thus writing a 1 to a cell may require 10 times longer than writing a 0 to the cell.

What is desired is a phase-change memory that compensates for asymmetric write times. A phase-change memory that is designed for data-sensitive write delays is desired. A high performance, high write-throughput phase-change memory is desirable, both at the chip level and at a sub-system level of many PCM chips.

DETAILED DESCRIPTION

The present invention relates to an improvement in phase-change memories. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Phase-Change Memory—FIGS. 1-4

Figure 1:
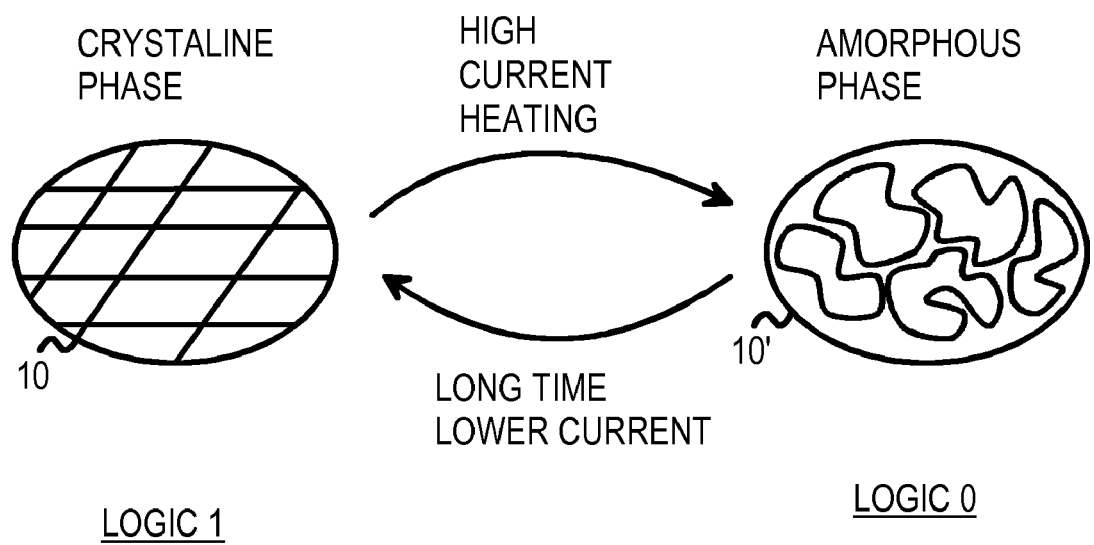
FIG. 1 shows a phase-change memory cell.
Figure 1:

FIG. 1 shows a phase-change memory cell. Phase-change memory (PCM) uses a layer of chalcogenide glass that can be switched between a crystalline and an amorphous state. The chalcogenide glass layer can be an alloy of germanium (Ge), antimony (Sb), and tellurium (Te). This alloy has a high melting point, which produces the amorphous state when cooled from the melting point. However, when the solid alloy is heated from the amorphous state, the alloy transforms into a crystalline state at a crystallization temperature than is below its melting point. Such heating can be provided by an electric current through the alloy. The state change may occur rapidly, such as in as little as 5 nanoseconds.

In FIG. 1, when alloy resistor 10 is in the crystalline state, its resistivity is low. The crystalline state represents a logic high or 1. A PCM memory cell has alloy resistor 10 in series with select transistor 12 between a bit line BL and a voltage V. When V is a low voltage such as ground, and word line WL is driven high, the bit-line voltage is pulled from a high pre-charged state to ground through select transistor 12 and alloy resistor 10 due to the low resistance of alloy resistor 10.

When alloy resistor 10' is in the amorphous state, its resistivity is high. The amorphous state represents a logic low or 0. Another PCM memory cell has alloy resistor 10' in series with select transistor 12' between a bit line BL and a voltage V. When V is a low voltage such as ground, and word line WL is driven high, the bit-line voltage remains in its high or pre-charged state, since the high resistance of alloy resistor 10' limits current through select transistor 12'.

Note that the assignment of logical 0 and logic 1 states to the crystalline and amorphous states is arbitrary. The crystalline state could be assigned logical 1 or logical 0, with the amorphous state having the opposite logical value.

Alloy resistor 10 may be a small layer that is integrated with select transistor 12, such as a layer over or near the source terminal of transistor 12. Alternately, alloy resistor 10 may be a separate resistor device, such as a patterned line or snaking line between the source of select transistor 12 and ground.

When a high current is passed through alloy resistor 10, the alloy can transform from the crystalline state into the amorphous state. The high current creates resistive heating in alloy resistor 10 and the melting temperature is rapidly reached, causing the crystal to melt into a liquid. Upon rapid cooling, alloy resistor 10 solidifies into the amorphous state since there is little time for crystals to grow during cooling.

When a lower current is passed through alloy resistor 10 for a long period of time, the crystalline temperature is reached or exceeded. However, the current is not sufficient to cause the higher melting temperature to be reached. The amorphous alloy begins to crystallize over this long time period. For example, small crystal domains within the amorphous state may grow and absorb other domains until alloy resistor 10 contains one or just a few crystal domains.

Thus alloy resistor 10' transforms from the high-resistance amorphous state into the low-resistance crystalline state by applying a moderate current for a relatively long period of time, allowing the crystal to grow at the crystalline temperature. Alloy resistor 10 transforms from the low-resistance crystalline state into the high-resistance amorphous state by applying a high current for a relatively short period of time, allowing the crystal to melt into an amorphous blob at the melting temperature.

Figure 2:
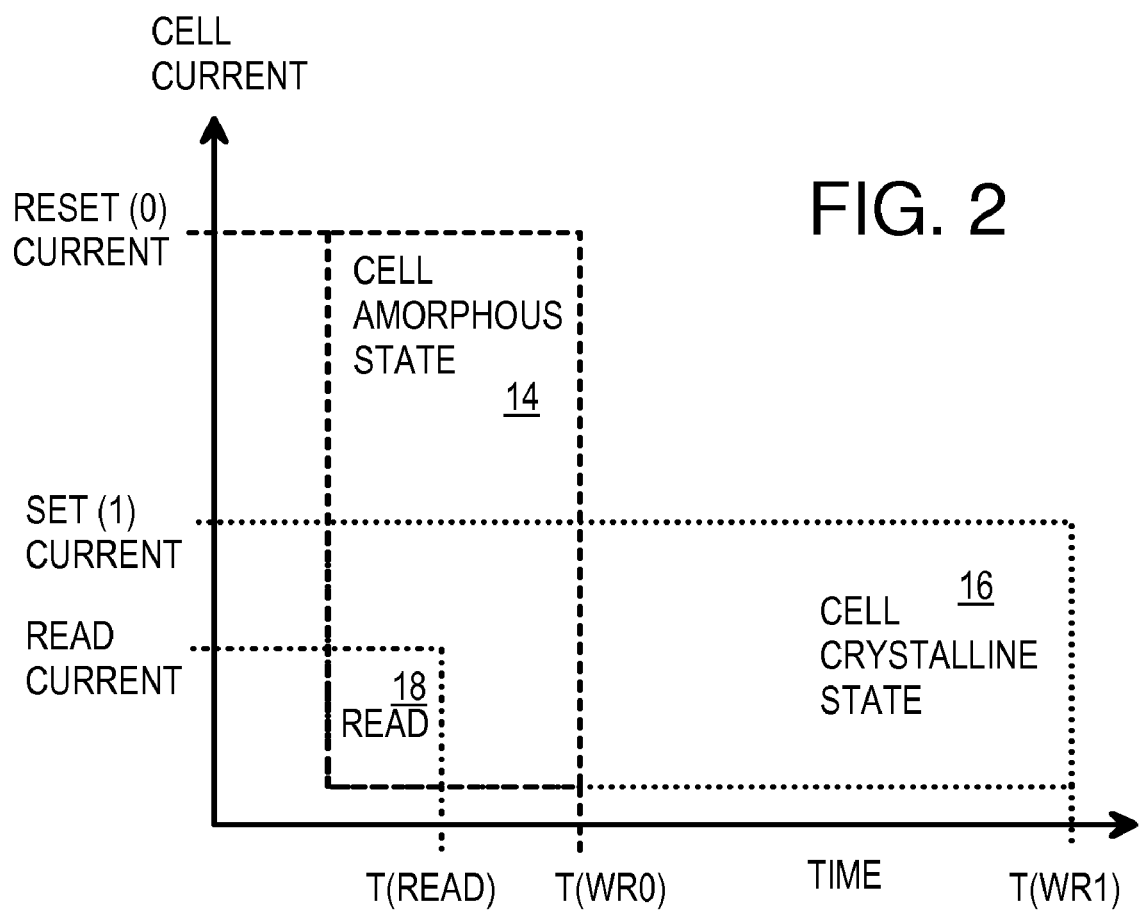
FIG. 2 is a graph of current and time to transform states in a phase-change memory cell.

FIG. 2 is a graph of current and time to transform states in a phase-change memory cell. Amorphous state 14 is reached when a high current (the reset current) is applied for a time of T(WR0). Crystalline state 16 is reached when a moderate current, the set current, is applied for a longer period of time T(WR1). These states are retained when currents below the moderate current are applied, or when currents are applied for short periods of time. State transformations, or partial state transformations, may occur when the full currents and times are not both met, such as applying the set current for less than the set time. These partial state transformations are undesirable.

The PCM cell can safely be read by applying a lower read current for a short period of time. For example, the read current can be less than either the set or reset currents. Reading 18 has the read current applied for less than the set or reset times, T(WR1), T(WR0), respectively. For example, the read time T(READ) can be less than half of the reset time, and the read current can be less than half of the set current. The reset current can be double or more the set current, and the set time can be double, triple, 5×, or more of the reset time.

Since the set time T(WR1) is so much longer than the reset time T(WR0), the time to write a memory cell is dependent on the data itself. Since data often contains both 1's and 0's, both setting and resetting can occur for the same data word. The reset time can overlap with the longer reset time, allowing both set and reset to overlap in time. Then the overall write time is determined by the longer set period of time.

Figure 3:
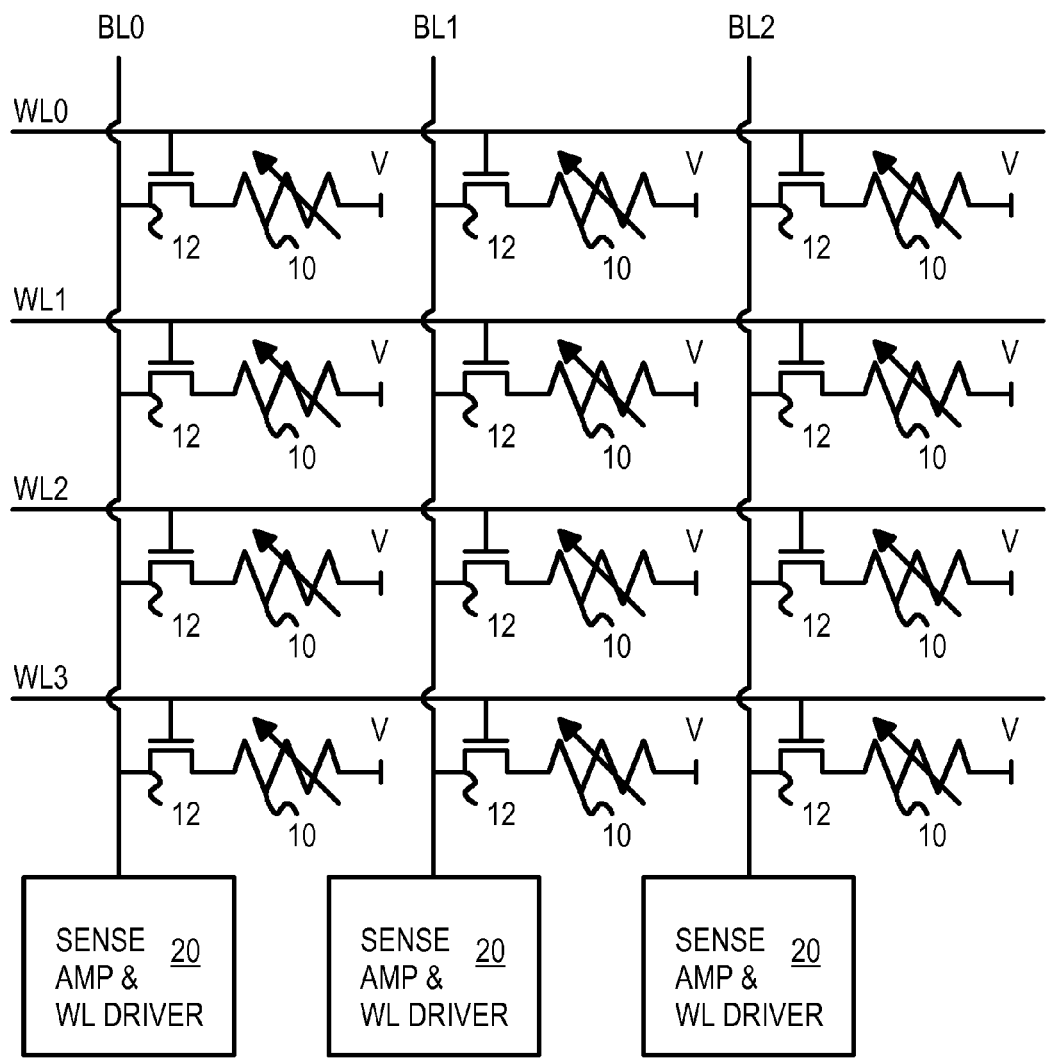
FIG. 3 shows an array of phase-change memory cells.

FIG. 3 shows an array of phase-change memory cells. Word lines WL0:3 are applied to the gates of select transistors 12, while bit lines BL0:2 connect to the drains of select transistors 12. Alloy resistors 10 are in series between the sources of select transistors 12 and a cell voltage V, which could be ground, power, or some other voltage, and could be switched on and off, such as for power down or to disable an array or block.

Alloy resistors 10 each can be in a high-resistance amorphous state, or in a low-resistance crystalline state. The current drawn from a bit line by select transistor 12 and alloy resistor 10 in the selected word line (row) is sensed by sense amplifiers 20 and amplified and buffered to generate the data read from the cell. The current drawn through alloy resistor 10 is less than or equal to the read current.

During writing, sense amplifiers 20 activate bit-line drivers that drive the set or reset current onto the bit lines and through the selected alloy resistor. After the current is applied for the set or reset time, alloy resistor 10 is transformed into the new state, either the amorphous or crystalline state. One cell per column is written, since only one of the word lines is activated at a time. Columns being written into the 0 state have the reset current applied to the bit line for the reset time period, while columns being written into the 1 state have the set current applied for the set time period.

Figure 4:
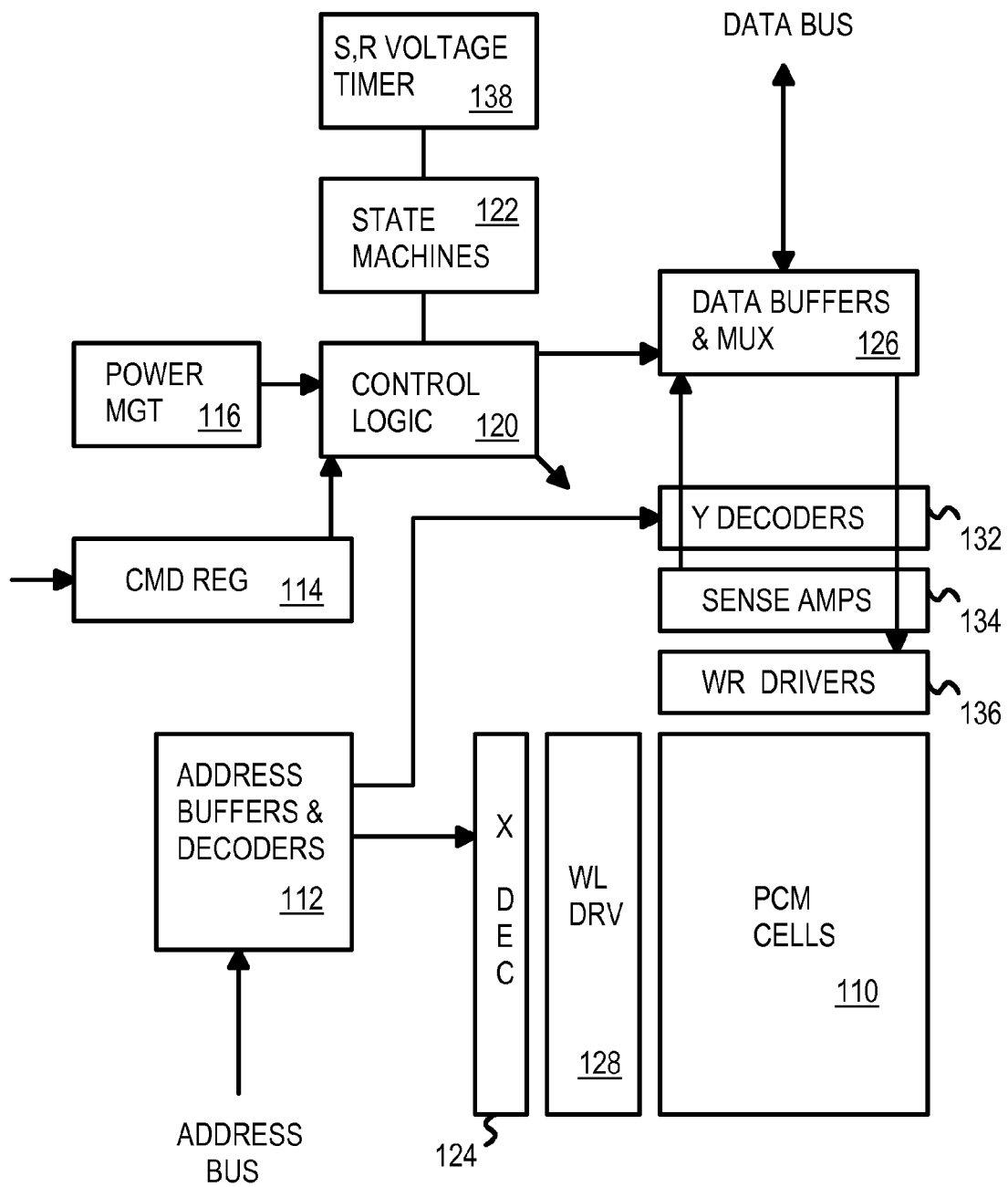
FIG. 4 shows a phase-change memory.

FIG. 4 shows a phase-change memory. A PCM chip may include some or all of the blocks shown in FIG. 4, and other blocks, or some of the functions may be performed by a separate PCM controller.

PCM cells 110 form an array of rows and columns of select transistors and alloy resistors that change between crystalline and amorphous phase states. The high and low resistance values of the 2 phase states are sensed by sense amplifiers 134 when a read current is drawn through a selected row of PCM cells. Word line drivers 128 drives one row or word line in PCM cells 110 while the other rows are disabled. A row portion of an address applied to address decoder 112 is further decoded by X decoder 124 to select which row to activate using word line drivers 128.

A column portion of the address applied to address decoder 112 is further decoded by Y decoder 132 to select a group of bit lines for data access. Data buffers 126 may be a limited width, such as 64 bits, while PCM cells may have a larger number of bit lines, such as 8×64 columns. One of the 8 columns may be selected by Y decoder 132 for connection to data buffers 126.

During writing, external data is collected by data buffers 126 and applied to write drivers 136. Write drivers 136 generate voltages or currents so that the set currents are applied to bit lines for PCM cells that are to be written with a 1, while higher reset currents are applied to bit lines for PCM cells to be reset to 0.

Set, reset voltage timer 138 includes timers that ensure that the set currents are applied by write drivers 136 for the longer set period of time, while the reset currents are applied for the shorter reset time period, and write drivers 136 for reset PCM cells are disabled after the reset time period. Both set and reset currents could be applied at the same time, such as for a period that the reset pulse overlaps the longer set pulse. Alternately, set and reset pulses could be non-overlapping. This may reduce peak currents, but increase write time. Since the reset time is perhaps one-tenth of the set time, write delays may increase by 10% or so.

State machines 122 can activate set, reset voltage timers 138 and cause control logic 120 to disable write drivers 136 after the set and reset time periods have expired. State machines 122 can generate various internal control signals at appropriate times, such as strobes to pre-charge bit lines and latch sensed data into data buffers 126.

Command register 114 can receive commands that are decoded and processed by control logic 120. External control signals such as read/write, data strobes, and byte enables may also be received in some embodiments. Command register 114 may be replaced by a command decoder in some embodiments. Power management unit 116 can power down blocks to reduce power consumption, such as when the PCM chip is de-selected. Since PCM cells 110 are non-volatile, data is retained when power is disconnected.

There may be several arrays of PCM cells 110 and associated logic on a large PCM chip. An array-select portion of the address can be decoded by address decoders 112 to enable one of the many arrays or blocks on the PCM chip.

Figure 5:
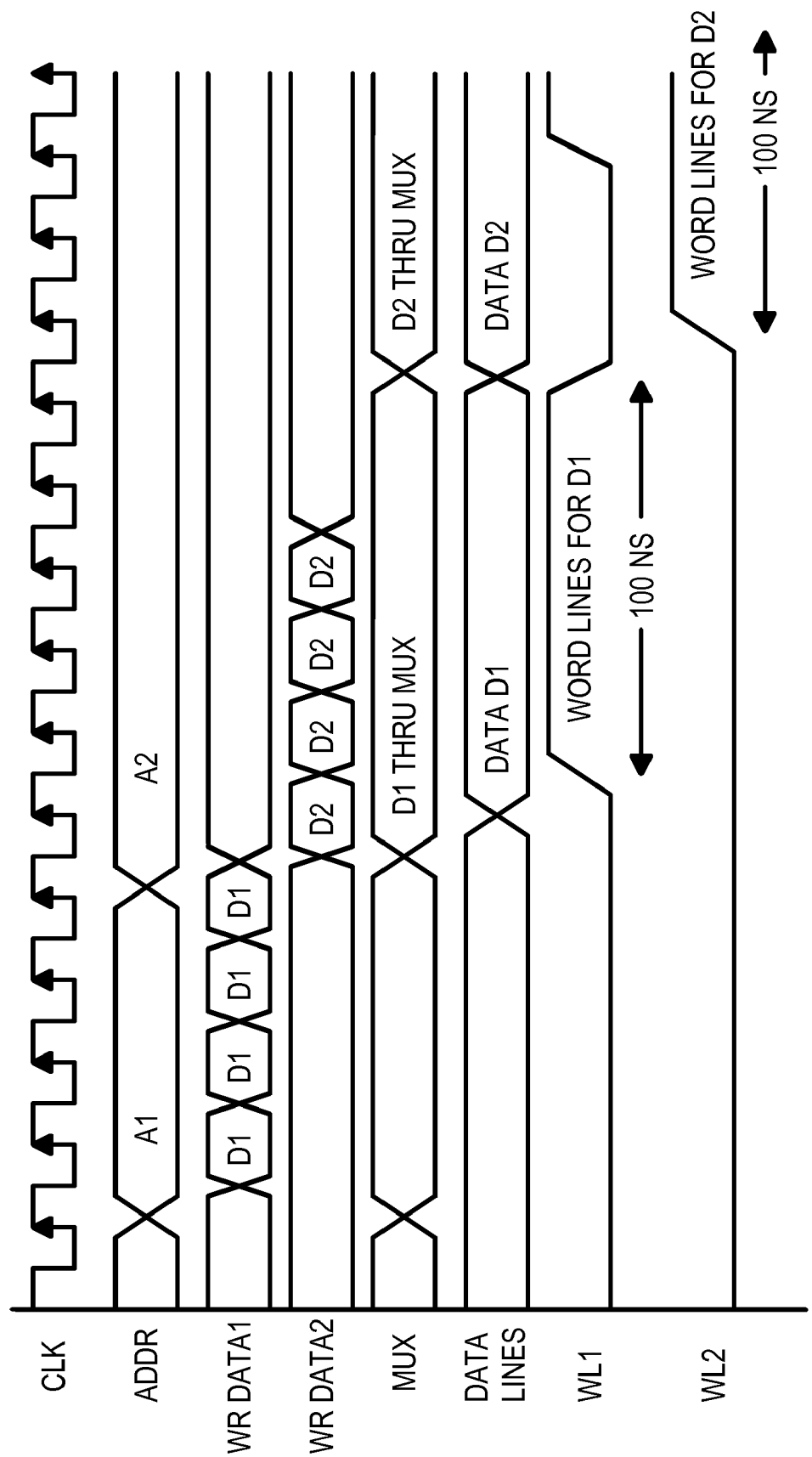
FIG. 5 is a waveform highlighting write timing for a single-array PCM chip.

FIG. 5 is a waveform highlighting write timing for a single-array PCM chip. When the PCM memory cells are arranged into a single array, or into a group of arrays that can allow only one access at a time, the asymmetric write delays may cause problems such as undesirable wait states.

During a first write access, a write command is latched into a PCM chip, and address A1 is also latched in and decoded to select a word line and a column of bits lines. Data from a host to be written into the PCM is received as a burst of 4 data items, such as 2 bytes per burst cycle for a total of 8 bytes of data D1.

The address and data may be stored in the PCM chip in an input latch, allowing the next cycle to begin. The next address A2 can be received and the next data D2 can be bursted in, depending on the size of the input latches and pipelining of the PCM chip. However, it is unlikely that more that 2 accesses may be concurrent. The second access (address A2, data D2) is put on hold while the current access completes. Wait states are added to the second access while the first access completes the internal writing to the PCM memory cells.

Once all 4 D1 data items are received, data D1 is sent through an internal mux and is driven onto internal data lines that connect to bit lines that access PCM memory cells when their word line is driven high. The word line must remain high for the longer set period of time, while the set currents are applied to bit lines for PCM cells that are to be written high. Reset currents for PCM cells that are being written low can be applied for shorter periods of time, either concurrent with the longer set currents, or before or after the set currents. For overlapping set and reset currents, the word lines must remain active for the set period of time, about 100 ns. This allows time for crystals to grow in the alloy resistors in the PCM cells being set. The set current can be disconnected from the cell by de-activating the word line as shown, or by reducing the bit-line currents.

Once the long 100 ns set period has elapsed, the PCM cells have been written. The internal write is complete. The word line is deactivated and the bit lines can be equalized, precharged, or discharged to a neutral state such as to set up a next read or write. The next access can then continue.

The D2 data is sent through the mux onto the data and bit lines, allowing the set and reset current or their corresponding voltages to be applied to the selected column of bit lines. The word line decoded by the A2 address is activated, allowing the set and reset currents to set and reset PCM cells, according to the state of data in D2. This again requires 100 ns or so for the longer set time of growing crystals in the alloy resistors in the memory cells.

A recovery time may be needed between writing D1 and D2 to the PCM array. This recovery time (not shown) may be needed to equalize or precharge bit lines or word lines. The extra recovery time may increase the number of wait states and delays for back-to-back writes.

Since the A2/D2 access has to wait for internal writing of D1 to complete, back-to-back write performance is degraded relative to isolated writes. The long set time period peculiar to phase-change memories exacerbates this performance degradation.

The inventors have realized that performance may be enhanced by interleaving arrays or banks of phase-change memories. Interleaving allows different banks to alternately write data during overlapping periods of time. To further improve the effectiveness of interleaving, local latching of write data at the banks allows the write data to be stored as close as possible to the memory cells being written. Data lines between banks are then freed up for transferring data to other banks. Thus the necessary routing resources can be reduced while still improving performance. The asymmetric write delays can be compensated for by interleaving and local write buffering.

Figure 6A:
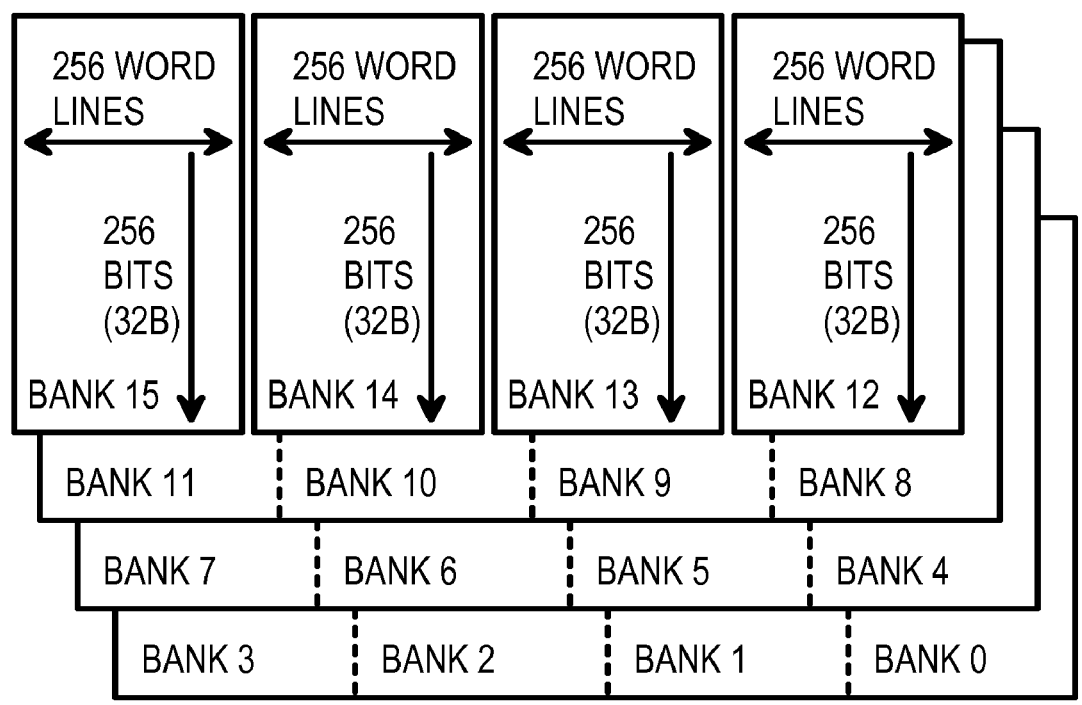
FIG. 6A shows an interleaved phase-change memory.

FIG. 6A shows an interleaved phase-change memory. A 1 mega-bit memory is arranged as 16 banks, with each bank having 1M/16=64K bits. Each of the 16 banks has 256 word lines (rows) and 256 bit lines. The 256 bit lines can be arranged as 32 1-byte columns.

Figure 6B:
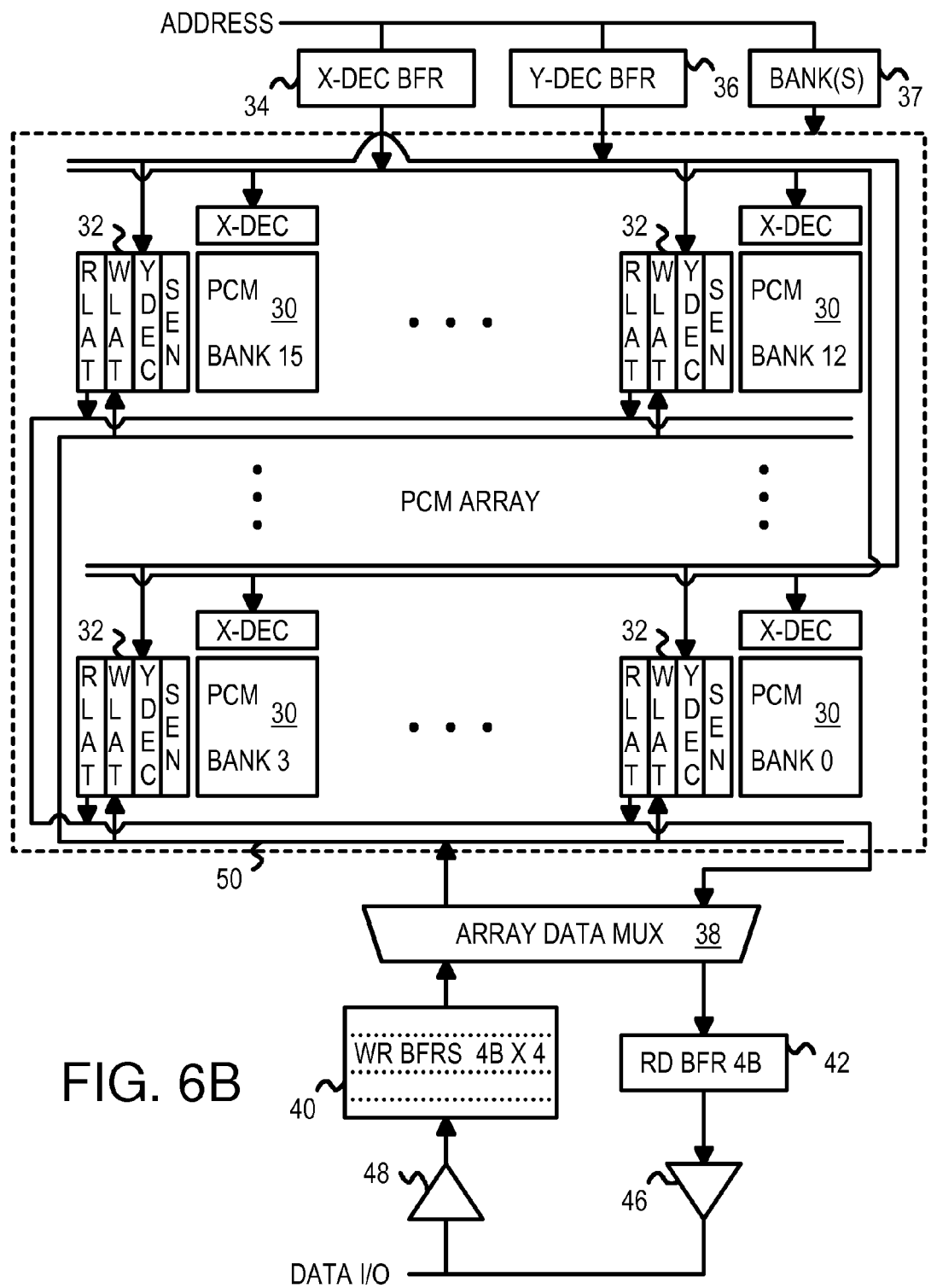
FIG. 6B shows local write latching at the interleaved banks forming a PCM array.

FIG. 6B shows local write latching at the interleaved banks forming a PCM array. The input address is divided into 3 parts. The upper 8 address bits in X-decode buffer 34 are applied to X-decoders to each of banks 30. The X-decoders select one of the 256 word lines in each of banks 30.

The middle 5 address bits in Y-decode buffer 36 are applied to Y-decoders to each of banks 30. The Y-decoders select one of the 32 byte-wide columns of bits lines in each of banks 30.

The lower 4 address bits in bank-address buffer 37 select one or more of the 16 banks for access. Additional logic, such as control logic or address sequencing logic (not shown), may alter the 4 address bits in bank-address buffer 37 to activate several of banks 30 at the same time to write in multiple bytes at a time.

Each bank 30 in the PCM array has an X-decoder and a Y-decoder to select one byte of memory cells for reading or writing. Sense amplifiers (SEN) each sense a pair of bit lines that connect to the memory cell to read a bit of data. The read data can be latched or buffered by read latch RLAT before being transferred over data lines to read buffer 42 through array data mux 38. Read data from read buffer 42 is driven off-chip by output buffers 46.

Write data enters the PCM chip through input buffers 48 and are stored in write buffers 40. Write buffers 40 can have four buffers of 4 bytes per buffer. The width each buffer in write buffers 40 can match the width of data lines 50 to the PCM array. When the width of the external Data I/O differs, two or more external bus cycles may be needed to fill each 4-byte buffer in write buffer 40. For example, a 16-bit external data bus requires 2 bus cycles to fill each 4-byte buffer in write buffers 40, while a 32-bit external bus requires only 1 bus cycle.

Each of banks 30 also contains a local bank write latch. The bits lines in each bank 30 are driven by write drivers from the data in bank write latch 32. Data from write buffers 40 are transferred to bank write latch 32 over data lines 50 through array data mux 38. Once the data is latched and stored in bank write latch 32, array data mux 38 can send different data over data lines 50, such as write data to other banks.

By providing bank write latch 32 for each of banks 30, the slow write process can be decoupled from data lines 50. Write drivers read the write data from bank write latch 32 and generate the set and reset currents onto the bit lines to write the data into the PCM cells in bank 30. Since the data is stored locally with each bank, the slow set-write process can occur concurrently with data transfers to other banks. Data throughput for slow phase-change writes into the crystalline state is vastly improved by local write-data storage at the interleaved banks. Sufficient time for growing crystals in the alloy resistors is provided without blocking other writes and data transfers.

FIGS. 7A-F illustrate local write latching at interleaved banks of phase-change memory to hide slow data-set writes that grow crystals. The 16 banks of PCM can be interleaved in a variety of ways. The sequence of addresses of the data being written can affect the order and efficiency of transfers.

Figure 7A:
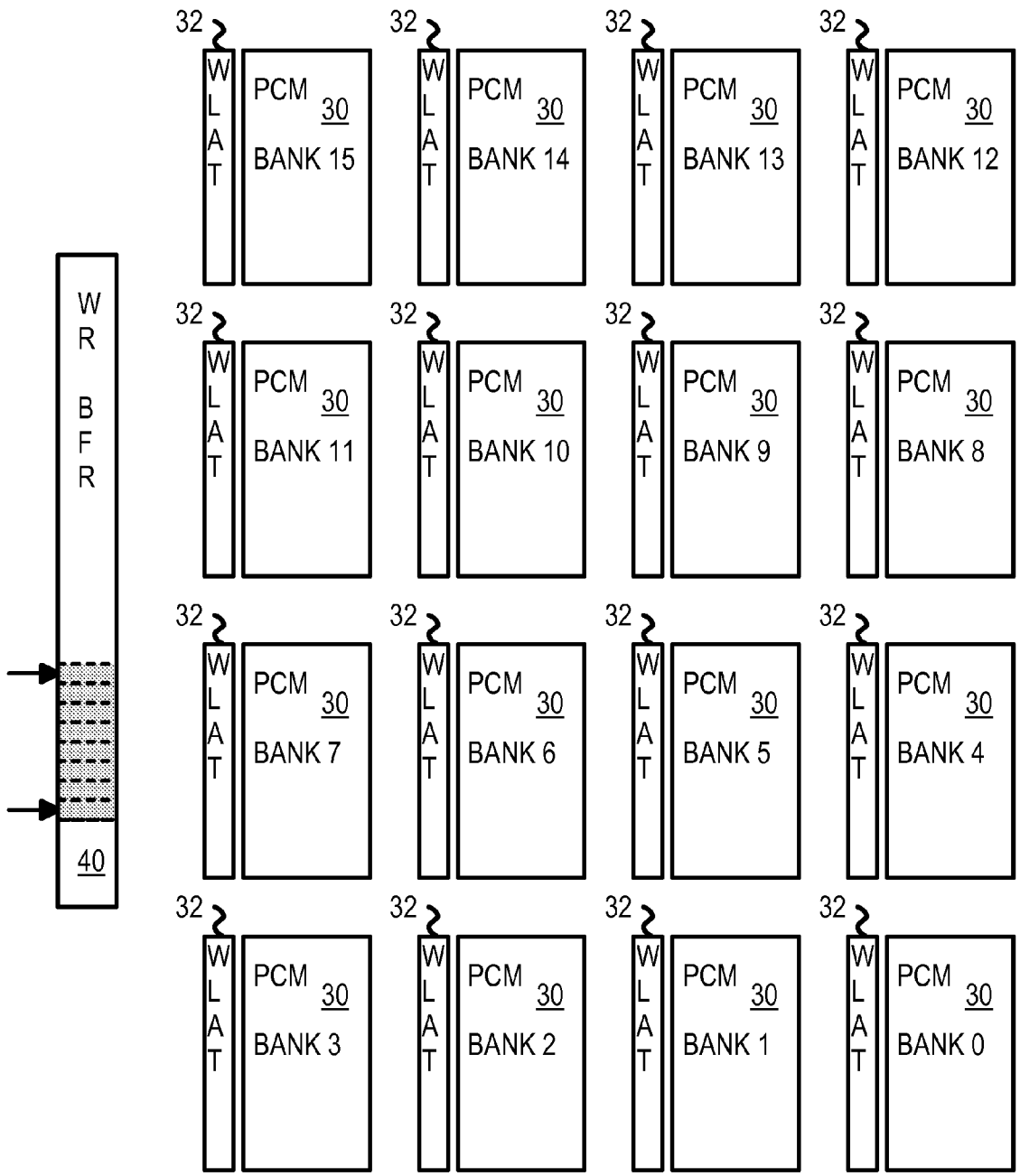
FIGS. 7A-F illustrate local write latching at interleaved banks of phase-change memory to hide slow data-set writes that grow crystals.
Figure 8:
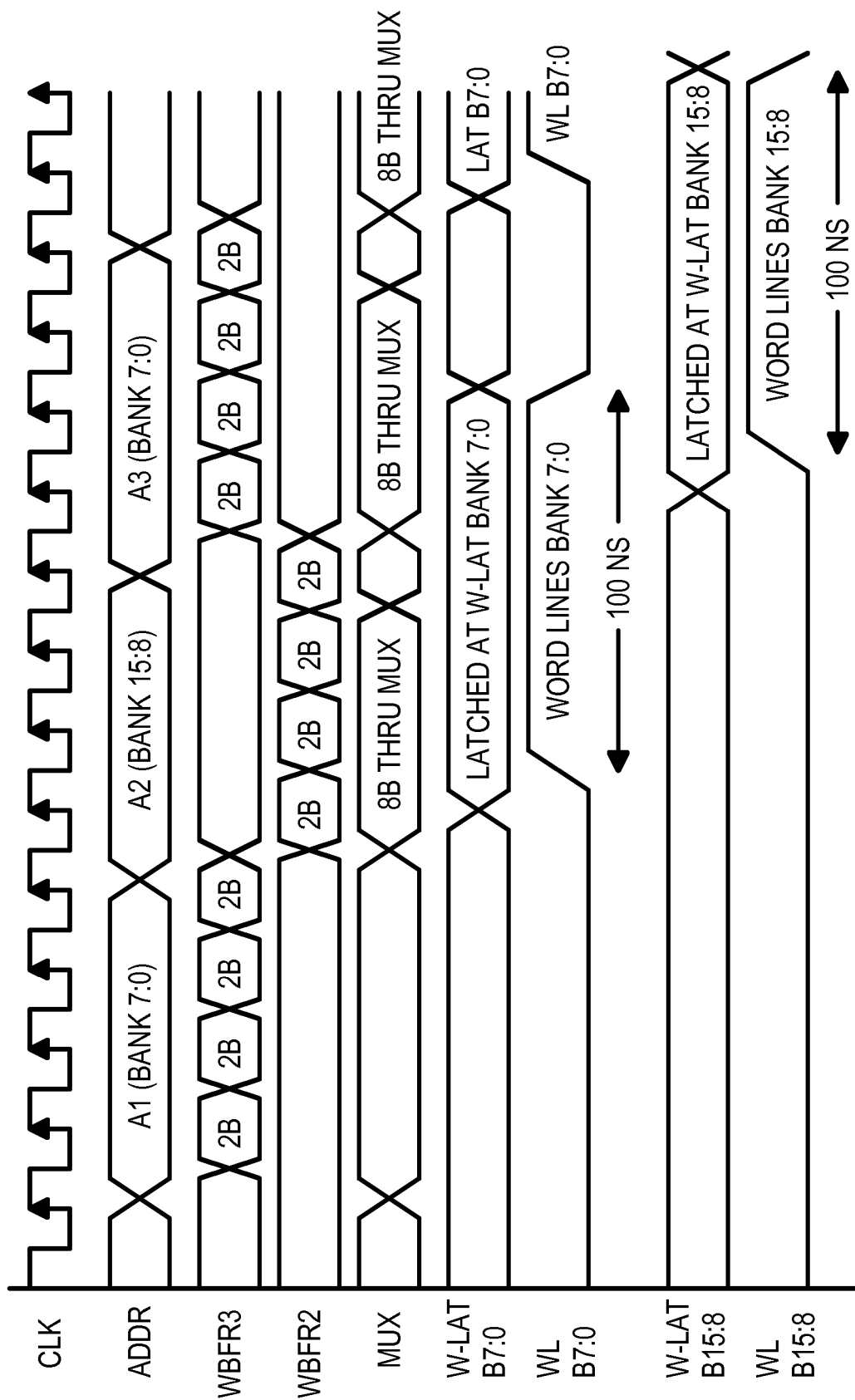
FIG. 8 is a waveform of concurrent writes using local write latches at interleaved banks of phase-change memory.

In FIG. 7A, 8 bytes have been written from a host into write buffers 40. The address for this transfer is also latched, or is generated from a local sequencer such as a direct-memory access (DMA) engine. These 8 bytes are for addresses that correspond to locations in banks 15:8. One byte is to be stored in each of the 8 upper banks 15:8 for this data access.

Figure 7B:
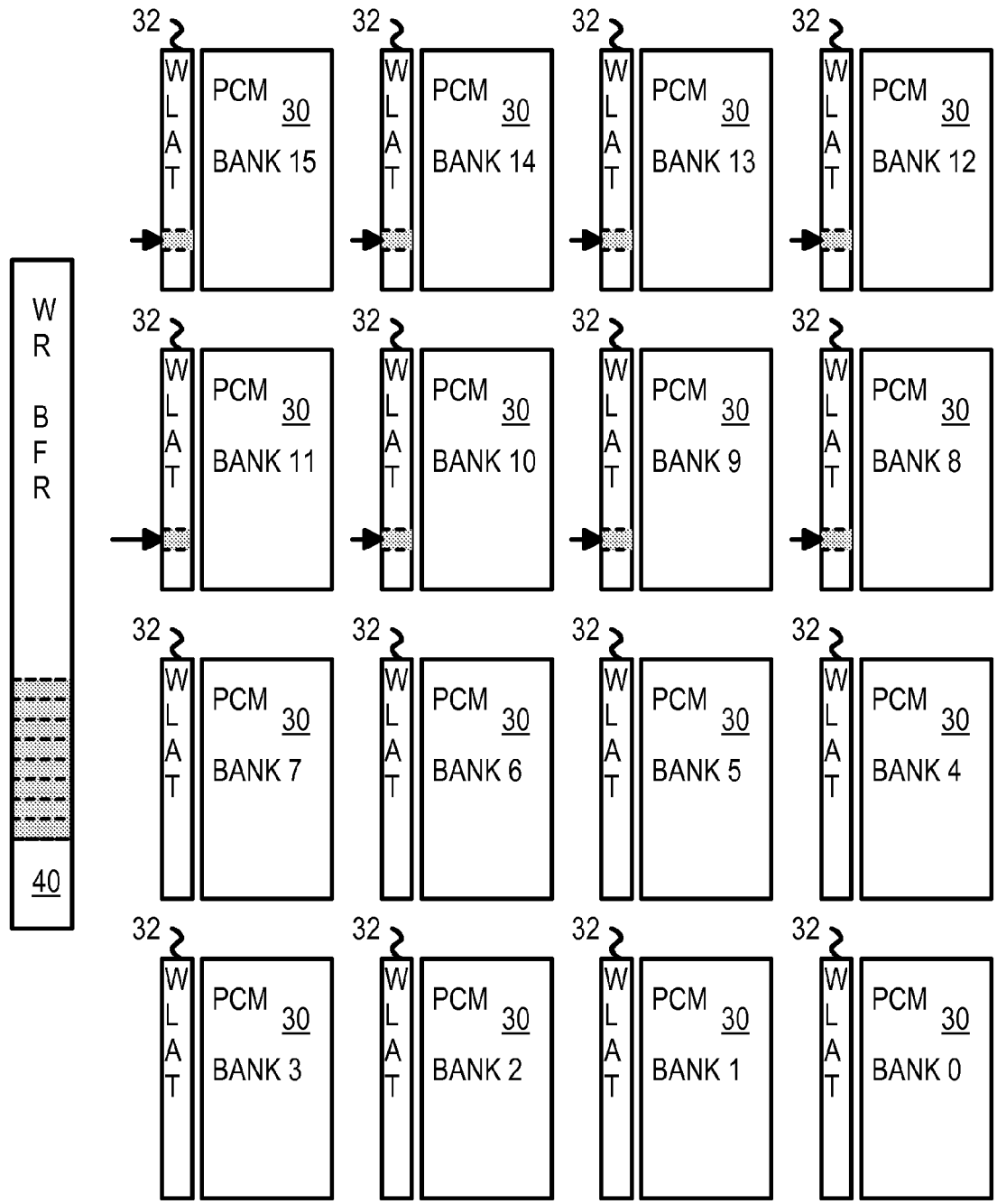

In FIG. 7B, the 8 bytes of write data are transferred through array data mux 38 (FIG. 6B) to data lines 50 and then stored in bank write latches 32 for banks 15:8. Local copies of each data byte are now stored next to each bank array. Once the data bytes are latched into bank write latches 32, the data lines can be re-used, and new host data can over-write the bytes in write buffers 40.

Figure 7C:
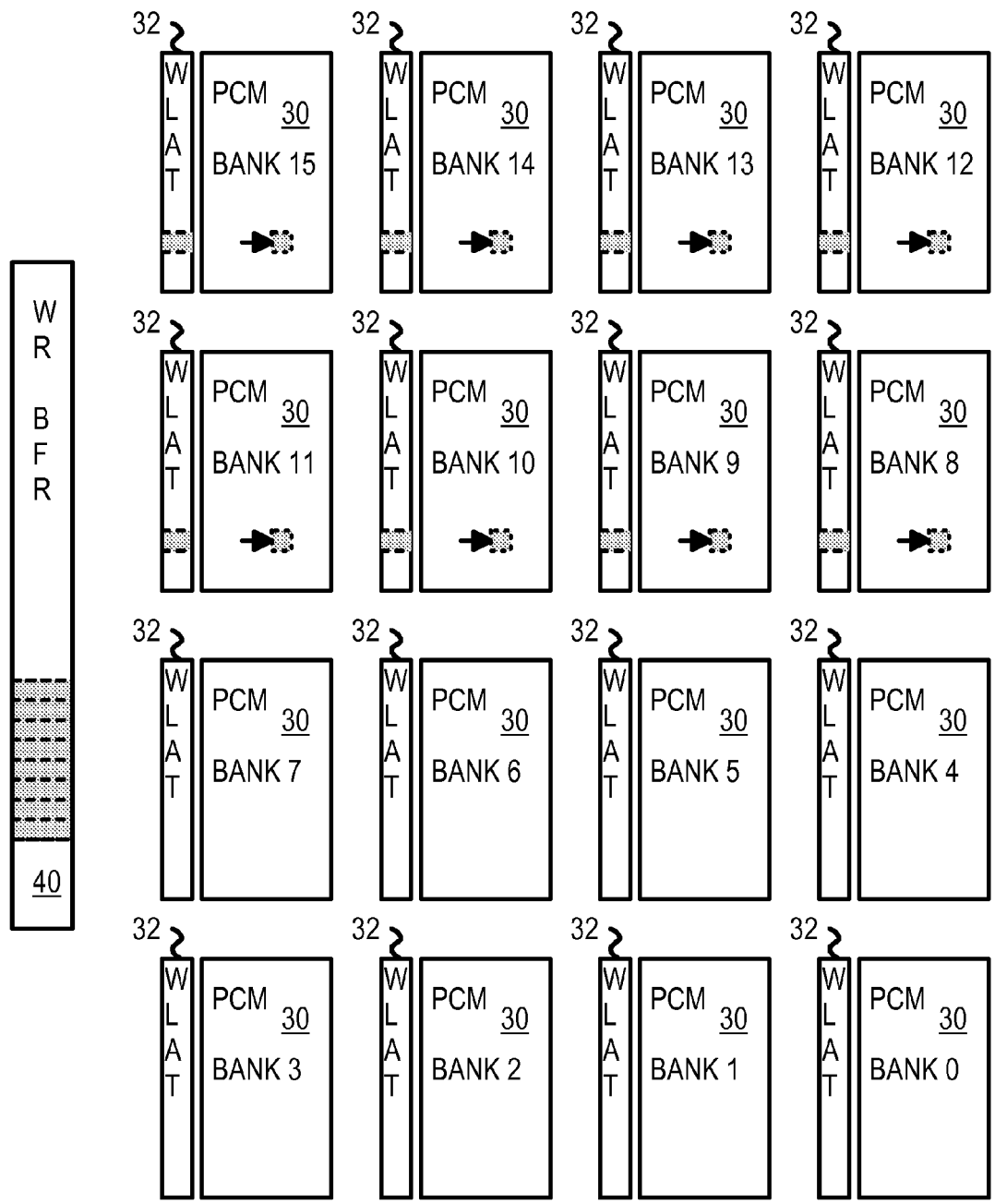

In FIG. 7C, the long PCM write cycles occur. The data byte in bank write latch 32 is written into the 8 PCM memory cells that are selected by the word line (local X-decoder) and column (local Y-decoder). The set and reset currents to drive onto the bit lines are generated by write drivers in response to the polarity of each data bit in bank write latch 32.

The high reset current is applied for the shorter reset period of time to each bit being written to a 0, to melt its alloy resistor into the amorphous state. The smaller set current is applied for the long set period of time for each data bit being set to 1 to grow crystal domains in the alloy resistor to generate the low-resistivity crystalline state. This process can take 100 ns, which is much longer than the data-transfer time over data lines 50. During this 100 ns period, the data lines are not connected to this bank but may transfer data to other banks.

Figure 7D:
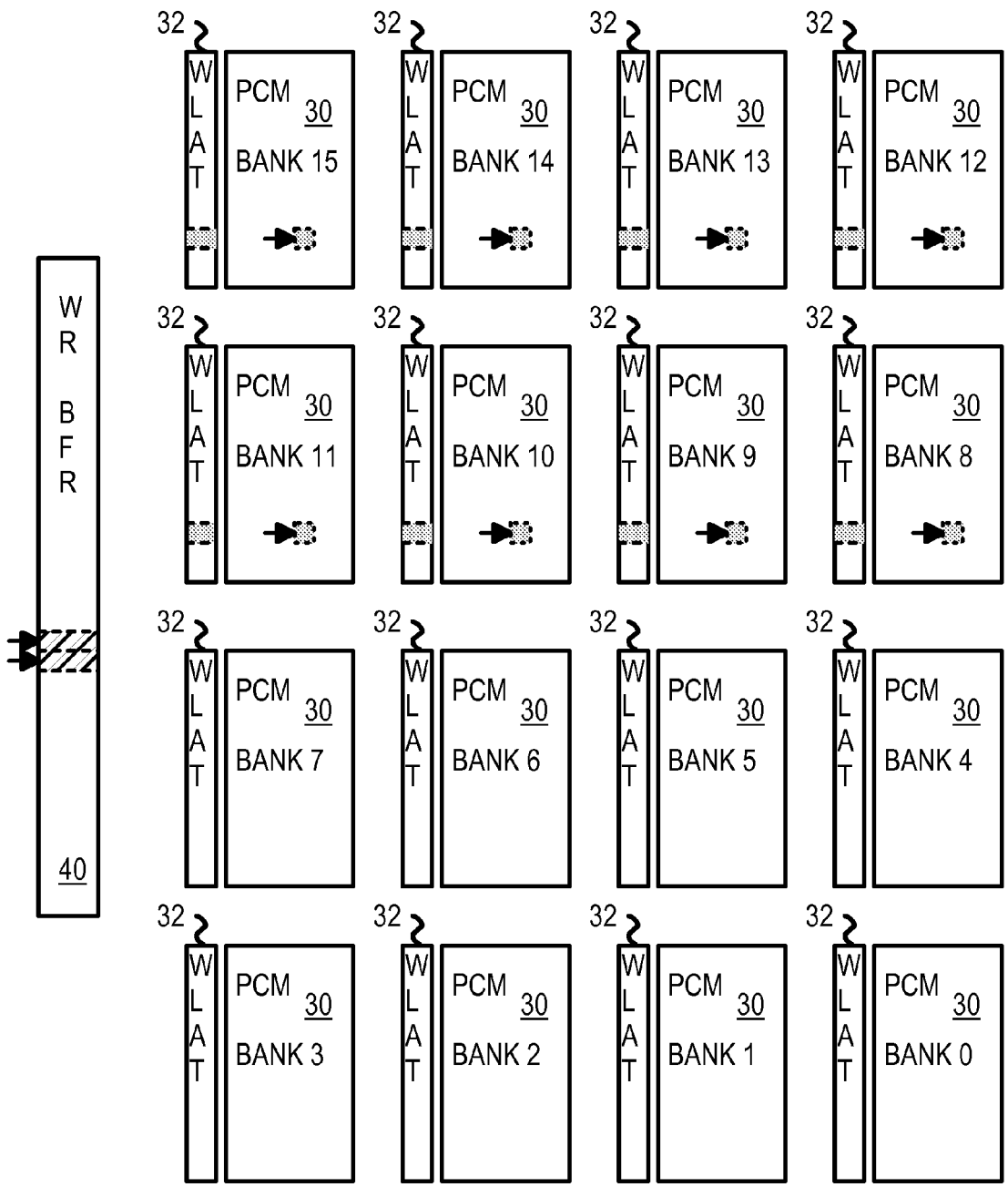

In FIG. 7D, 2 more bytes are written into write buffers 40 by the host for a second data access. A different address is latched into the chip. The 100 ns set-write period is still going on in banks 15:8.

Figure 7E:
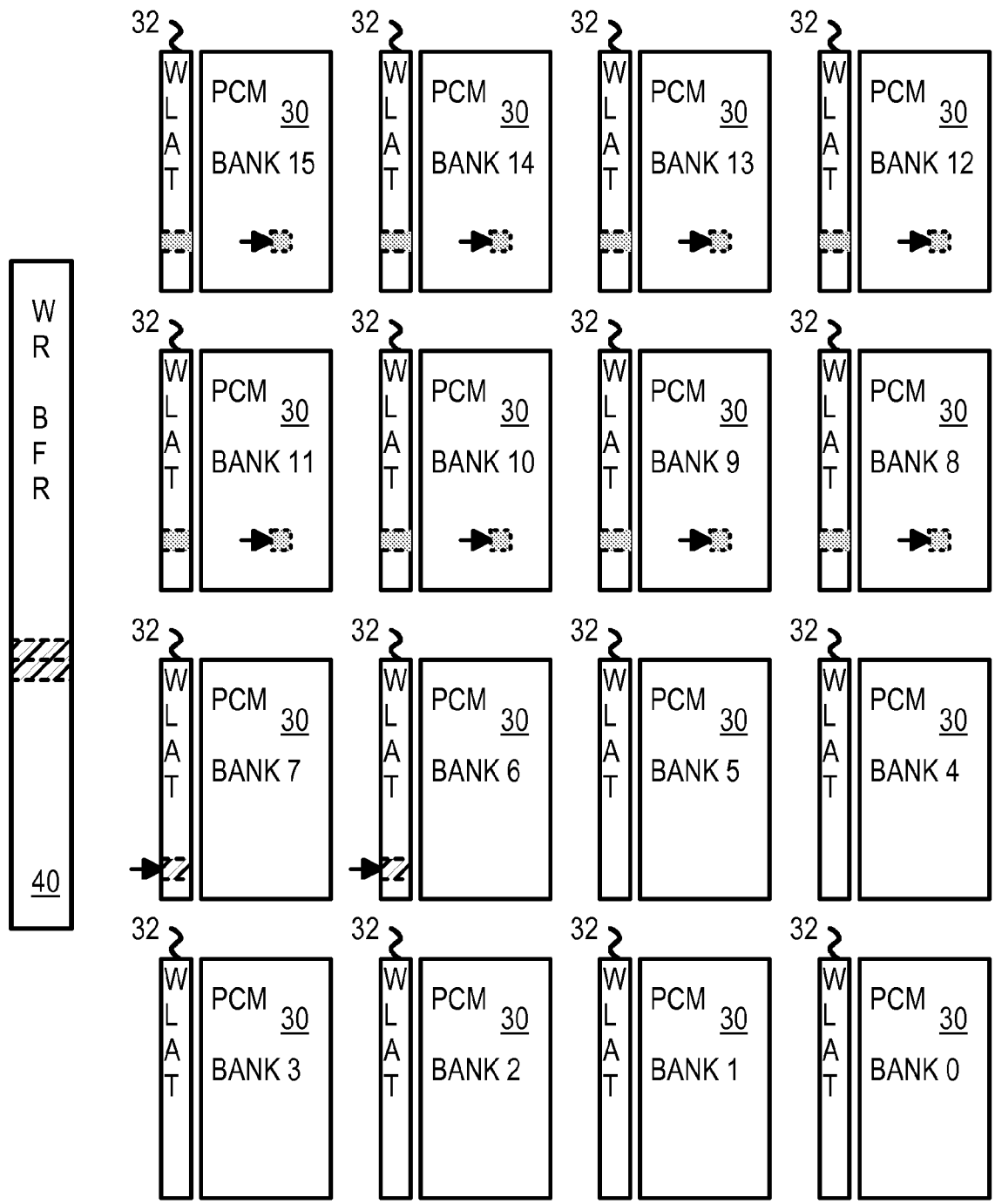

In FIG. 7E, the 2 bytes in write buffers 40 are transferred through array data mux 38 and over data lines 50 to bank write latches 32 in banks 7, 6. Banks 7,6 are selected by the address from the host. The 100 ns set-write period is still going on in banks 15:8.

Figure 7F:
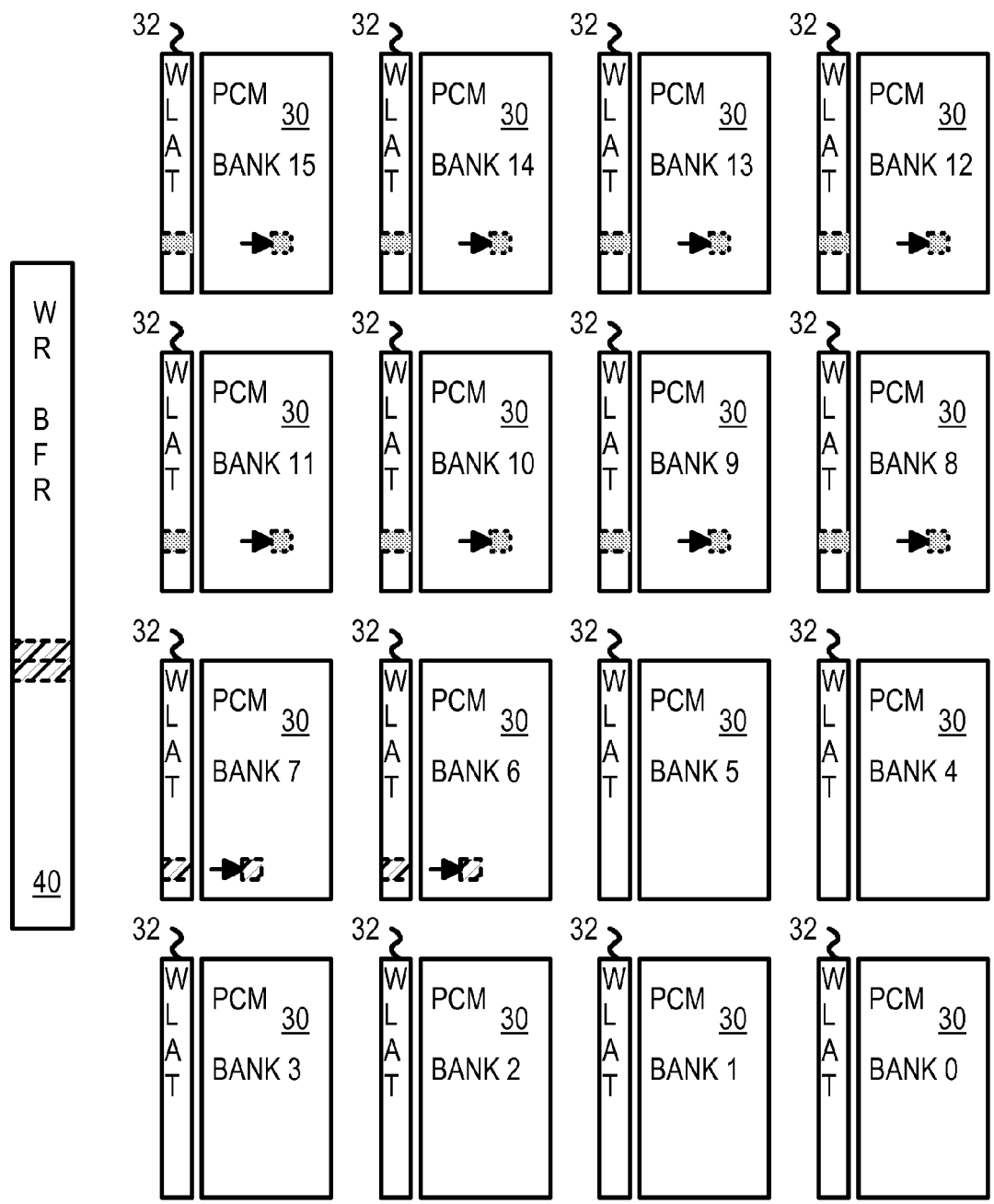

In FIG. 7F, the 2 bytes that are locally latched in bank write latches 32 at banks 7, 6 are written into PCM cells in banks 7, 6. The data byte in bank 7 write latch 32 is written into the 8 PCM memory cells that are selected by the word line (local X-decoder) and column (local Y-decoder) applied to bank 7. The set and reset currents to drive onto the bit lines are generated by write drivers in response to the polarity of each data bit in bank write latch 32. Bank 6 is likewise written from its own bank write latch 32. Set currents are generated over another 100 ns period, with a shorter reset current pulse for reset data.

During this second 100 ns period, the data lines are not connected to these banks 7, 6 but may transfer data to other banks. The first 100 ns set-write period is still going on in banks 15:8. Thus the long set-write periods can overlap for different banks.

Another (third) write access cycle could now occur, writing bytes to any of banks 5:0. Once the first write finishes, other data could be written to banks 15:8.

FIG. 8 is a waveform of concurrent writes using local write latches at interleaved banks of phase-change memory. In this example, the external data bus is 16 bits, and 2 bytes are clocked into the PCM chip for each cycle of the 50 MHz clock.

The first access latches in address A1. Data D1 is loaded into write buffer WBFR3. Once all 8 bytes are latched in, the 8 bytes are passed through array data mux 38 and over data lines 50 to bank write latches 32 for banks 7:0. One byte is latched into the local bank write latch 32 for each of the 8 lower banks. The D1 data remains locally latched for about 6 clock cycles while the word lines are activated from decoding of the A1 address, and the bit lines drive the PCM cells with the set and reset currents. About 100 ns is needed for writing 1's to the cells. The set period of time can be 5×, 10×, or some other multiple of the reset period of time.

Once the D1 data has been latched into WBFR3, the next access cycle can begin. Address A2 is latched and data D2 is loaded into write buffer WBFR2. The 8 D2 bytes can be applied to the data lines after the D1 data has been locally latched into bank write latches 32 for banks 7:0. Since address A2 decodes to upper banks 15:8, the writes for addresses A1, A2 can be concurrent.

The D2 data is passed through array data mux 38 and onto data lines 50 after D1 has been latched, and after all 8 D2 bytes have been received from the host. The 8 D2 bytes are locally latched by bank write latches 32 at upper banks 15:8, with one byte latched per upper bank.

The D2 data remains locally latched for about 6 clock cycles while the word lines are activated from decoding of the A2 address, and the bit lines drive the PCM cells with the set and reset currents. About 100 ns is needed for writing 1's to the cells. However, this 100 ns for D2 (banks 15:8) overlaps with the prior 100 ns for D1 (banks 7:0).

The next access can begin without delay by latching address A3 and loading 8 bytes into WBFR3, when the address is for the lower banks. Wait states are not needed for accesses to sequential addresses as shown in this example.

Sequential accesses are common for large data transfers, so such interleaving can be effective. When back-to-back addresses occur that decode to the same bank, then wait states are still needed. Sequential accesses are common for many streaming and block-transfer applications such as media file transfers (digital cameras, videos, audio, etc.) and solid-state disks.

In this example with a 50 MHz clock and 2 bytes per cycle, 100 M bytes can be written per second, matching the external bus transfer rate. Wait states are not needed for sequential addresses. Without local bank write latching, more than 100 ns is needed per access, plus another clock cycle for address decoding prior to word line selection, and data rates can drop to around 17 M bytes per second.

When the external data width is increased to 4 bytes, the clock rate can be decreased to 30 MHz to save power and still attain a data rate of 120 M bytes per second. Without local buffering the data rate drops to 30 M bytes per second, even with the wider data interface.

ALTERNATE EMBODIMENTS

Several other embodiments are contemplated by the inventors. For example different numbers and arrangements of banks may be used, such as 32 banks, 64 banks, or 8 banks. The number of banks may be roughly matched to the ratio of set to reset times. For example, a 100 ns set time and 10 ns reset time has a ratio of 10, and can use 10 or more banks interleaved, such as 16 banks. Should the set time be reduced to 50 ns, the ratio drops to 5, and 5 or more banks, such as 8 banks, may be optimal. Data lines 50 (FIG. 6B) may allow only 1 byte to be transferred at a time, and the bank write latches 32 could be loaded sequentially. Alternately, data lines 50 may be wider, allowing 2 banks to be loaded at once. An 8-byte-wide data lines 50 could allow all bank write latches 32 for 8 banks to be written at once. Other combinations of data widths are contemplated.

Addresses may be latched at the local banks in the local X-decoder and local Y-decoder. The X-decoder latches the X portion of the address, either before or after decoding, while the Y-decoder latches the Y portion of the address, either before or after decoding. A bank enable may also be latched. Alternately, addresses may be latched outside of the PCM bank array. Sequential addresses could be internally generated or altered. Various burst orders of the data bytes and addresses may be used.

While an 8-bit data byte has been described, the data word could be other widths, such as 4 bits, 12 bits, 16 bits, or multiples of 8 bits, or other values. Array data mux 38 could be a mux with logic gates or transmission gates, or could use wired-OR logic or be a bus multiplexer that uses the data lines that are physically connected to several or all banks, and are controlled to connect each data byte to just one bank at a time. Time multiplexing may also be employed.

While a PCM chip with various internal functions has been described, some functions could be performed outside of the PCM chips, such as by a PCM controller, microcontroller, glue logic, bus controller, or other chips. Address translation or pre-decoding could also be performed. The PCM array could be on several chips rather than on one chip, or could be integrated with a larger system chip having other functions such as a processor.

The PCM cells can use select transistors in series with the variable resistor as shown, or additional transistors may be added, such as for a dual-port memory with 2 bit lines per cell, and two select transistors that connect to the same alloy resistor. The melting and crystalline temperatures may vary with the alloy composition and with other factors such as impurities. The shape and size of the alloy resistor may also affect these temperatures and set, reset time periods.

The terms set and reset can be applied to either binary logic state. For example, set can refer to changing to the logic 1 state for positive logic, or to changing to the logic 0 state for negative or inverse logic. Likewise, reset is to 0 for positive logic, but inverted logic can reset to 1, such as for active-low logic. Set and reset can also refer to remaining in the previous state, such as setting a cell that is already 1. One system can use both active-high and active-low logic domains, and logic can refer to the physical states of the memory cells, or the data read at the I/O of a memory chip, or at some other point.

Directional terms such as upper, lower, up, down, top, bottom, etc. are relative and changeable as devices are rotated, flipped over, etc. These terms are useful for describing the device but are not intended to be absolutes. Some embodiments may have chips or other components mounted on only one side of a circuit board, while other embodiments may have components mounted on both sides.

The waveforms shown are idealized. Actual waveforms, such as those measured on lab equipment such as an oscilloscope, may have different shapes, slopes, and noise. Pulses may be offset in time relative to each other to further reduce peak currents, and other techniques may be used to reduce peak currents.

The address decoders may be included as part of a memory controller, microcontroller, serial engine, DMA, PCM memory controller, transaction manager, or other controllers. Functions can be implemented in a variety of ways. Some functions can be programmed and executed by a CPU or other processor, or can be implemented in dedicated hardware, firmware, or in some combination. Many partitioning of the functions can be substituted.

A standard flash, DRAM, or SRAM controller may be integrated with the PCM controller to allow for accessing these various kinds of memories. Routines may contain instructions that are part of the operating system, basic input-output system (BIOS), manufacturer-specific routines, and higher-level application programs, and various combinations thereof. Various modified bus architectures may be used. Buses such as the local bus may have several segments isolated by buffers or other chips.

The phase-change memory has been described as having cells that each store one binary bit of data. However, multi-level cells are contemplated wherein multiple logic levels are defined for different values of resistance of the alloy resistor.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A locally-latched phase-change memory (PCM) comprising:
    a data input that receives a data word in response to a write request and a write address;
    a data output that outputs a data word in response to a read request and a read address;
    a host write buffer, coupled to the data input, for storing the data word;
    a plurality of PCM cells each having a first logical state having an alloy in a crystalline phase and a second logical state having the alloy in an amorphous phase, wherein a resistance of the alloy is higher when in the amorphous phase than when in the crystalline phase;
    a plurality of banks, each bank comprising:
    an array of the plurality of PCM cells;
        an X decoder, receiving an X portion of the write address or receiving an X portion of the read address, for selecting a row of the PCM cells selected by an activated word line selected from a plurality of word lines in the array;
        a Y decoder, receiving a Y portion of the write address or receiving a Y portion of the read address, for selecting a column of the PCM cells in the array as selected PCM cells;
        local sense amplifiers for reading read data stored in the selected PCM cells in response to the read address;
        local write drivers for driving a set pulse for a set period of time to the selected PCM cells that are being written to the first logical state, and for driving a reset pulse for a reset period of time to the selected PCM cells that are being written to the second logical state;
        local bank write latches, storing write data that includes set data bits indicating the first logical state and reset data bits indicating the second logical state, the local bank write latches coupled to control the local write drivers to drive the set pulse and the reset pulse to the selected PCM cells; and shared data lines, driven by the host write buffer, for transferring write data from the data word in the host write buffer to the local bank write latches for a selected bank in the plurality of banks, wherein the selected bank is selected by a bank portion of the write address;

an array data mux that disconnects the shared data lines from the local bank write latches of a prior selected bank before the set and reset pulses are applied to the selected PCM cells, allowing data transfer to the selected bank while the set and reset pulses are being applied to the prior selected bank, whereby set and reset pulses are driven to the selected PCM cells from data stored in the local bank write latches, freeing the shared data lines when the set and reset pulses are applied.

2. The locally-latched phase-change memory of claim 1 wherein a PCM cell in the plurality of PCM cells comprises:
a select transistor receiving a word line on a gate, and having a channel between a bit line and a cell node;
an alloy resistor formed from the alloy, coupled between the cell node and an array voltage;
wherein the PCM cell has the first logical state when the alloy resistor has the alloy in the crystalline phase, the alloy resistor having a low resistance that increases a sensing current from the bit line through the select transistor;
wherein the PCM cell has the second logical state when the alloy resistor has the alloy in the amorphous phase, the alloy resistor having a high resistance that reduces the sensing current from the bit line through the select transistor;
wherein the high resistance is larger than the low resistance;
whereby the sensing current is altered by the alloy being in the crystalline phase and the amorphous phase.

3. The locally-latched phase-change memory of claim 2 wherein the local write drivers further comprise:
a set current generator, coupled to the bit line, for driving a set current through the select transistor and through the alloy resistor for a set period of time to write the PCM cell into the first logical state in response to set data bits in the local bank write latches;
a reset current generator, coupled to the bit line, for driving a reset current through the select transistor and through the alloy resistor for a reset period of time to write the PCM cell into the second logical state in response to reset data bits in the local bank write latches;
a reset timer for determining the reset period of time; and
a set timer for determining the set period of time;
wherein the set period of time is at least double the reset period of time,
whereby the PCM cell is set for a longer time period, and reset for a shorter time period.

4. The locally-latched phase-change memory of claim 3 wherein the reset current is at least twice the set current, and wherein the set current is at least twice the sensing current;
whereby the PCM cell is set by a lower current for a longer time period, and reset by a higher current and a shorter time period.

5. The locally-latched phase-change memory of claim 4 wherein the alloy is a chalcogenide glass layer having a melting point that is higher than a crystallization point.

6. The locally-latched phase-change memory of claim 5 wherein the alloy is an alloy of germanium (Ge), antimony (Sb), and tellurium (Te).

7. The locally-latched phase-change memory of claim 5 wherein the plurality of banks comprises 16 banks.

8. The locally-latched phase-change memory of claim 7 wherein the local bank write latches store a byte of write data for each bank in the plurality of banks.

9. The locally-latched phase-change memory of claim 5 wherein the selected PCM cells comprises 8 selected PCM cells.

10. The locally-latched phase-change memory of claim 5 wherein the host write buffer comprises a plurality of buffers each for a different access request.

11. The locally-latched phase-change memory of claim 5 wherein the bank portion of the write address comprises a least-significant-bit (LSB) portion of the write address;
whereby the plurality of banks are LSB interleaved.

12. The locally-latched phase-change memory of claim 5 wherein each bank in the plurality of banks further comprises:
local read latches, coupled to the local sense amplifiers, for locally storing read data.

13. The locally-latched phase-change memory of claim 12 further comprising:
read data lines, coupled to the local read latches, for transferring the read data to the data output in response to the read request,
whereby separate data lines for read and write are provided.

14. The locally-latched phase-change memory of claim 5 wherein each bank in the plurality of banks has an array of the plurality of PCM cells that comprises an array of 256 rows and 32 columns.

15. A memory system comprising:
phase-change memory means for storing a data word data as binary bits each represented by a chalcogenide glass layer having a melting point that is higher than a crystallization point, the chalcogenide glass layer forming a variable resistor that alters a sensing current when a binary bit is read;
wherein a crystalline state of the variable resistor represents a first binary logic state and an amorphous state of the variable resistor represents a second binary logic state for binary bits stored in the phase-change memory means;
bus I/O means for receiving a data I/O word from a host in response to a write request from the host, and for outputting a data I/O word to the host in response to a read request from the host;
I/O buffer means for storing the data I/O word received from the host by the bus I/O means until a data word is accumulated;
a plurality of bank means for storing interleaved data, each bank means comprising:
an array formed of a plurality of cells of the phase-change memory means, the array having rows and columns;
row decoder means, receiving a row address, for selecting a selected row of the plurality of cells in response to the row address;
column decoder means, receiving a column address, for selecting a selected column of the plurality of cells in response to the column address;
wherein selected cells of the phase-change memory means in the array are at an intersection of the selected row and the selected column;
bank write latch means for storing data bits to write into the selected cells;
sense amplifier means for reading data stored in the selected cells by sensing a difference in resistance of the variable resistor when in the crystalline state and when in the amorphous state; and data line transfer means, coupled between the I/O buffer means and the bank write latch means in the plurality of bank means, for transferring portions of the data word stored in the I/O buffer means to the bank write latch means of a second bank means in the plurality of bank means while the bank write latch means in a first bank means in the plurality of bank means is writing data into the selected cells, whereby bank writing occurs concurrently with data transfer to another bank.

16. The memory system of claim 15 wherein each bank means further comprises:

set current timer means, coupled to the bank write latch means, for applying a set current for a set period of time to the selected cells to set variable resistors into the crystalline state when the binary bits being written are in the first binary logic state;

reset current timer means, coupled to the bank write latch means, for applying a reset current for a reset period of time to the selected cells to reset variable resistors into the amorphous state when the binary bits being written are in the second binary logic state;

wherein the reset current is at least twice the set current, and wherein the set current is at least twice a sensing current that passes through the variable resistor during a read operation;

wherein the set period of time is at least double the reset period of time, whereby the variable resistor is set by a lower current for a longer time period, and reset by a higher current and a shorter time period.

17. The memory system of claim 16 wherein the data word stored in the phase-change memory means is retained when power is suspended, whereby the data word is stored in non-volatile memory.

18. A phase-change memory with local write buffering comprising:

a plurality of banks of memory cells, each bank in the plurality of banks having an array of memory cells;

an alloy resistor in each memory cell in each array of memory cells, the alloy resistor storing binary data as solid phases each having a different resistivity;

wherein the alloy resistor changes from a crystalline state to an amorphous state when a memory cell is written from a logic 1 state to a logic 0 state in response to a reset current for a reset period of time;

wherein the alloy resistor changes from the amorphous state to the crystalline state when the memory cell is written from a logic 0 state to a logic 1 state in response to a set current for a set period of time;

wherein the amorphous state has a higher resistance than the crystalline state that is sensed by a sense amplifier;

a data input for receiving a data word to store in the phase-change memory;

a write buffer, coupled to the data input to receive the data word;

data lines coupled between the write buffer and the plurality of banks of memory cells, for transferring the data word to the plurality of banks;

a plurality of bank write latches, wherein each bank in the plurality of banks has a local bank write latch that receives a bank portion of the data word from the data lines;

a plurality of write drivers, wherein each bank in the plurality of banks has a local write driver that applies the set current for the set period of time to memory cells being written by bits in the logic 1 state in the bank portion of the data word stored in the local bank write latches, and that applies the reset current for the reset period of time to memory cells being written by bits in the logic 0 state in the bank portion of the data word stored in the local bank write latches;

wherein the set period of time is at least 5 times longer than the reset period of time;

wherein unequal set and reset pulses are applied to the alloy resistors to for changes between the crystalline state and the amorphous state; and a plurality of bank sense amplifiers, wherein each bank in the plurality of banks has a local bank sense amplifier that senses data stored in selected memory cells by sensing currents passing through alloy resistors having a higher resistance when in the amorphous state than when in the crystalline state;

wherein the bank portion of the data word is written from the local bank write latches into the memory cells while the data lines are disconnected from writing the local bank write latches, the data lines able to transfer data to other banks in the plurality of banks while the data word is written from the local bank write latches into the memory cells, whereby concurrent writes and data transfers to different banks are performed.

19. The phase-change memory with local write buffering of claim 18 wherein the set period of time is about 100 nanoseconds.

20. The phase-change memory with local write buffering of claim 18 wherein the data word stored in the memory cells is retained when power is disconnected, wherein the alloy resistors remain in the amorphous state and remain in the crystalline state when power is disconnected;

whereby the data word is stored in non-volatile memory.

* * * * *